US011026351B2

(12) United States Patent
Kulkarni et al.

(10) Patent No.: US 11,026,351 B2
(45) Date of Patent: Jun. 1, 2021

(54) COMPUTING APPARATUS WITH CLOSED COOLING LOOP

(71) Applicant: Intel Corporation, Santa Clara, CA (US)

(72) Inventors: Devdatta P. Kulkarni, Olympia, WA (US); Richard J. Dischler, Bolton, MA (US)

(73) Assignee: Intel Corporation, Santa Clara, CA (US)

( * ) Notice: Subject to any disclaimer, the term of this patent is extended or adjusted under 35 U.S.C. 154(b) by 484 days.

(21) Appl. No.: 15/754,957

(22) PCT Filed: Sep. 25, 2015

(86) PCT No.: PCT/US2015/052377
§ 371 (c)(1),
(2) Date: Feb. 23, 2018

(87) PCT Pub. No.: WO2017/052628
PCT Pub. Date: Mar. 30, 2017

(65) Prior Publication Data
US 2020/0245511 A1 Jul. 30, 2020

(51) Int. Cl.
*H05K 7/20* (2006.01)
*H05K 1/02* (2006.01)
*H05K 1/18* (2006.01)

(52) U.S. Cl.
CPC ....... *H05K 7/20809* (2013.01); *H05K 1/0203* (2013.01); *H05K 1/181* (2013.01);
(Continued)

(58) Field of Classification Search
CPC ..................... H05K 7/20809; H05K 7/20309
See application file for complete search history.

(56) References Cited

U.S. PATENT DOCUMENTS 6,973,801 B1 * 12/2005 Campbell ............. H01L 23/473
165/104.32
2006/0126294 A1    6/2006 Faneuf et al.
(Continued)

OTHER PUBLICATIONS

International Search Report and Written Opinion dated Jun. 22, 2016 for International Application No. PCT/US2015/052377, 15 pages.

*Primary Examiner* — Mukundbhai G Patel
(74) *Attorney, Agent, or Firm* — Schwabe, Williamson & Wyatt, P.C.

(57) ABSTRACT

The present disclosure describes embodiments of apparatuses and methods related to a computing apparatus with a closed cooling loop thermally coupled to one or more processors disposed on a circuit board of the computing apparatus. The closed cooling loop circulates a dielectric fluid to absorb heat from the processor. A portion of the dielectric fluid is evaporated from the processor heat absorbed by the dielectric fluid. A heat exchanger is coupled to the circuit board and thermally coupled to the closed cooling loop. The heat exchanger is to include a coolant flow to remove heat from the dielectric fluid circulated through the portion of the closed cooling loop thermally coupled to the heat exchanger. A vapor portion of the dielectric fluid is condensed from the heat removed by the coolant flow. Other embodiments may be described and/or claimed.

20 Claims, 3 Drawing Sheets

(52) U.S. Cl.
CPC ..... *H05K 7/20327* (2013.01); *H05K 7/20818* (2013.01); *H05K 2201/064* (2013.01)

(56) References Cited

U.S. PATENT DOCUMENTS

| | | | |
|---|---|---|---|
| 2008/0174962 A1* | 7/2008 | Belady | G06F 1/20 361/699 |
| 2009/0161312 A1* | 6/2009 | Spearing | H05K 7/20772 361/679.47 |
| 2009/0234705 A1 | 9/2009 | Brunschwiler et al. | |
| 2012/0255706 A1 | 10/2012 | Tadayon et al. | |
| 2012/0281359 A1 | 11/2012 | Arney et al. | |
| 2015/0237767 A1* | 8/2015 | Shedd | F28F 9/26 165/104.31 |
| 2017/0127563 A1* | 5/2017 | Chainer | F28F 27/02 |

\* cited by examiner

COMPUTING APPARATUS WITH CLOSED COOLING LOOP

STATEMENT OF GOVERNMENT INTEREST

This invention was made with Government support under contract number H98230-13-D-0124 awarded by the Department of Defense. The Government has certain rights in this invention.

CROSS REFERENCE TO RELATED APPLICATIONS

The present application is a national phase entry under 35 U.S.C. § 371 of International Application No. PCT/US2015/052377, filed Sep. 25, 2015, entitled "COMPUTING APPARATUS WITH CLOSED COOLING LOOP", which designated, among the various States, the United States of America. The Specification of the PCT/US2015/052377 Application is hereby fully incorporated by reference.

FIELD

Embodiments of the present disclosure generally relate to the field of computing apparatuses that are cooled by fluid cooling systems.

BACKGROUND

Generally, data centers are adopting liquid cooling to lower energy consumption and to achieve better power density. Liquid cooling approaches may include use of copper cold plates coupled to processors and the use of water as a cooling medium. Generally, current liquid cooling systems use a cooling distribution unit (CDU) outside of two to eight server racks. Cooling water, or other cooling fluid, may be pumped to a server rack from a CDU to cool servers mounted in the rack. Facility water may be pumped through the CDU to cool the water, or other cooling fluid, returned from the server rack. For the dense, multi-rack, high-performance computing markets where rack power may exceed 50-100 kW of heat dissipation per rack, liquid cooling generally is the only reasonable option. Racks in the 100 kW range may require pumping of a swimming pool's worth of water for effective cooling. Additionally, there are intricate flow paths for coolant through heavy, copper processor cold plates, which makes the pressure and flow requirements demanding. Larger, parallel flow paths for cooling may address some of these issues; however, this approach is more costly and requires heavy, bulky connectors and conduit. Generally, copper has to be used for cooling lines and connectors due to corrosion and inter-metallic compatibility issues. As the heat generated per rack increases, more CDUs per compute rack are needed. This requirement for more CDUs places further structural demands on data centers because of the weight of additional CDUs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe apparatuses and methods for a computing apparatus with a closed cooling loop coupled to a heat exchanger, and associated techniques and configurations.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "metal" may refer to any number of metals including alloys of metals and metal-ceramic composites. When referring to a specific metal, such as copper, such reference includes alloys of the specific metal. As the case may be for copper or aluminum, this may include alloys of copper and alloys of aluminum.

Various embodiments describe a high-density, low-weight, device cooling loop that may enable densely stacked, high-wattage servers to more efficiently move high heat loads to the rear of a rack where subsequently reduced water cooling flows may be applied. Details of these embodiments, as well as some advantages and benefits, are disclosed and described herein.

Figure 1:
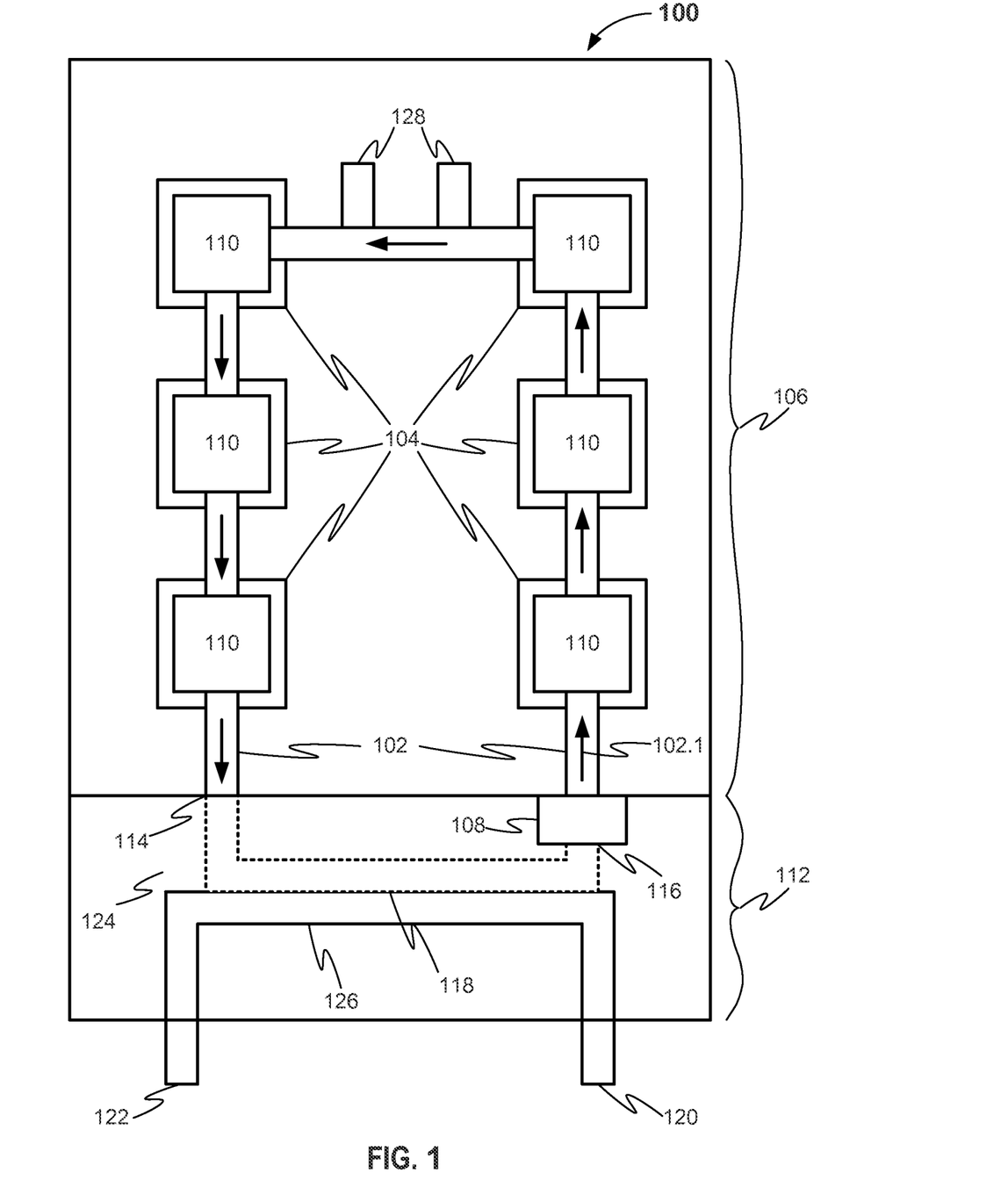
FIG. 1 schematically illustrates a computing apparatus with a closed cooling loop, in accordance with some embodiments.

FIG. 1 schematically illustrates a computing apparatus 100 with a closed cooling loop 102, in accordance with some embodiments. In some embodiments, the computing apparatus 100 may be a server. The server may be a blade server. In some embodiments, the computing apparatus 100 may include one or more processors 104 coupled to a circuit board 106. The processors 104 may generate heat when computing apparatus 100 is operated. The heat generated by processors 104 may need to be removed in order for computing apparatus 100 to operate efficiently. Thus, the closed cooling loop 102 may be thermally coupled to the one or more processors 104 to remove the heat from the processors 104.

The one or more processors 104 may be other heat-generating semiconductor devices such as voltage regulators (buck converters), for example. Accordingly, the term "processor" is used in a general sense for devices that may generate heat and may be cooled using the closed cooling loop 102.

In some embodiments, the closed cooling loop 102 may circulate a dielectric fluid to absorb the heat from the one or more processors 104. The closed cooling loop 102 may include tubing connected together to form the closed cooling loop 102. The tubing may be any suitable shape. The tubing may be metallic or non-metallic. The closed cooling loop 102 may include a number of couplings and/or valves to connect different portions together to provide a closed loop to circulate a dielectric fluid to the processors 104. In some embodiments, the closed cooling loop may include serial and/or parallel flow paths for the dielectric fluid to two or more processors. In some embodiments, the close cooling loop 102 spans across a circuit board and cools processors and/or other heat generating devices coupled to the circuit board.

In some embodiments, a fluid pump 108 may be coupled to the closed cooling loop 102 to circulate the dielectric fluid through the closed cooling loop 102. The fluid pump 108 may also be referred to as a "pump." In some embodiments, more than one pump 108 may be coupled to the closed cooling loop 102.

The closed cooling loop 102 may have a direction of circulation of the dielectric fluid through the closed cooling loop 102 as indicated by the arrows 102.1 in FIG. 1. When the dielectric fluid is circulated in the closed cooling loop 102, a liquid portion of the dielectric fluid may be evaporated from the heat absorbed from the one or more processors 104 by the dielectric fluid. Vaporization of a portion of the dielectric fluid may occur at each processor 104. In some embodiments, the closed cooling loop 102 may allow at least a portion of the dielectric fluid to remain in a liquid state in the closed cooling loop. In other words, there may be a liquid portion of the dielectric fluid in the closed cooling loop 102 throughout the complete loop.

The use of the heat of vaporization offered by dielectric phase-change liquids may allow embodiments to manage significant amounts of thermal energy. Heat may be vaporized and carried away at the temperature at which a silicon chip would need to start dumping heat away at a high rate. Each and every component in the system may be surrounded by a better heat transfer coefficient boundary condition (about 40,000 to 60,000 $W/m^2K$) even at low flow rates of 80 ml/min instead of 800 ml/min with single phase fluid, all due to the phase change from liquid to vapor.

The vaporizable dielectric fluid may be circulated through the closed cooling loop 102 with cold plates using a low power pump, such as a small 10 watt pump, for example, instead of a compressor. In some embodiments, the flow rate required for the closed cooling loop 102 may be five to ten times lower than the flow rate in water cooled systems. The lower flow rate may provide for the overall sizing of the cooling system to be considerably smaller and more compact, with much less weight. This may help to meet rack weight restrictions, which generally require a full rack to be less than 250 pounds per square foot. Furthermore, this lower pumping power may reduce cost and increase reliability of the various components used in the system.

In a simulation, the flow rate for two phase dielectric coolant was five to eight times lower than single phase fluid. This lower flow rate may translate to a smaller size of manifolds and more compact real estates for cooling. The heat transfer coefficient achieved on both simulations was in the range of 40,000 to 60,000 $W/m^2K$ in the fin area. These simulations indicated that the dielectric two phase cooling embodiments disclosed herein may achieve better thermal performance at a lower coefficient of performance (COP) as compared to liquid only cooling.

In some embodiments, multiple processors may be connected in series, even at lower fluid flow rates, and in this configuration, the case temperatures are maintained almost constant, namely at the temperature of vaporization of the dielectric fluid.

The closed cooling loop 102 may be coupled to numerous devices to be cooled in a series loop where the temperature at each device is kept nearly the same, namely, the boiling point of the dielectric fluid at the pressure inside the closed cooling loop. This substantially constant temperature may help to maintain performance with less area on a board taken up by the numerous devices being cooled. The temperature may remain substantially constant even with a variable load on a device. This substantially constant temperature may reduce thermal stresses and increase reliability of the device. For example, the substantially constant temperature at each device (node) may improve the entire reliability of a 50,000 node system by a huge margin and may make an exascale system run long enough to be useful. Additionally, since the temperature of a server case and devices (processors, for example) cooled by a cooling loop remain substantially constant, there may be no need to derate a processor board performance.

In some embodiments, the dielectric fluid may be a refrigerant. Almost any dielectric fluid may be used without significantly impacting the thermal performance R134a is very commonly used in the USA for auto, household, and industrial air conditioning appliances, while in Europe, HFO 1234 yf has been accepted as a replacement to R134a. In some embodiments, the refrigerant may include 1,1,1,2-tetrafluoroethane or 2,3,3,3-tetrafluoropropene. Other refrigerants may be used.

The dielectric fluid may be chemically inert and may be compatible with many metals, polymers and rubber as well. Thus, there may be little to no corrosion or scaling issues, which may, in turn, enhance the operational life of the closed cooling loop 102. If there is a leak of the dielectric fluid from the closed cooling loop 102, there may be no damage to the components of a server board since the fluid is a dielectric fluid. Some embodiments may use a rack-level leak sensor to detect a leak and to stop the operation for safety reasons. By integration of passive condensation control at server or rack level, complexity of moisture sensing sensors can be resolved. Any dielectric fluid that happens to leak, via a pinhole or otherwise, is not only non-conductive (electrically) but will also evaporate and not leave a puddle. There may be no need to actively monitor condensation at every server blade as with conventional liquid cooling approaches. Furthermore, due to the nature of the dielectric fluid, the closed cooling loop 102 may not need continuous monitoring and correction of factors like pH, conductivity, solid particles, chlorides, and hardness as required in conventional, water-based systems.

The nature and operating characteristics of the dielectric fluid may enable its use in a wide variety of environments around the world. For example, the operating temperature of the closed cooling loop 102 may be very wide and may be suitable for use in a large number of diverse climates. The dielectric fluid may not require any additional antifreeze or algae prevention additives. Additionally, the dielectric fluid may not have the same toxicity and contamination concerns as, for example, ethylene glycol, which was used in previous technologies. Further, the dielectric fluid may not have a high pressure drop penalty like propylene glycol. Thus, there may be no need to drain liquids near the compute nodes during shutdown in cold temperatures or any other time. This suitability to various environments may allow the closed cooling loop 102 to be charged before shipping.

In some embodiments, the closed cooling loop 102 may include one or more cold plates 110 coupled to the one or more processors 104. The cold plate 110 may also be referred to as "plates." A plate may include other shapes where a flat portion of the plate is directly coupled to the one or more processors 104. The cold plates 110 may be thermally coupled to the processors 104 to remove heat from the processors 104. The cold plates 110 may be metallic (for example, copper or aluminum), non-metallic, an alloy or a composite.

The closed cooling loop 102 may allow much higher packaging density on a board. The higher packaging density may, in turn, eliminate costly, long cables between devices that are being cooled by the closed cooling loop.

In some embodiments, the cold plates 110 may be an aluminum cold plate directly coupled to the processors 104. Aluminum cold plates may be used without any corrosion issues. Aluminum cold plates may be coupled to heat-generating devices along the closed cooling loop 102 and combined with other materials such as copper, brass, and/or rubber, and the like. Some embodiments may allow for cold plates to be connected in series, which allows faster changes in design or board due to different layouts. Changes in design may be influenced only by a total blade power limit.

The dielectric fluid may be circulated through the cold plates 110. At the cold plates 110, the dielectric fluid may absorb heat from the processors 104 while the dielectric fluid is circulated through the cold plates 110. As described above, a portion of the liquid form of the dielectric fluid may evaporate inside cold plates 110 from the heat absorbed by the dielectric fluid from processors 104.

In some embodiments, a heat exchanger 112 may be coupled to the circuit board 106 and thermally coupled to the closed cooling loop 102. The heat exchanger 112 may include a portion of the closed cooling loop 102 within the heat exchanger 112. The closed cooling loop 102 may enter the heat exchanger 112 at an inlet 114 and pass through the heat exchanger 112. A dielectric fluid may travel through the closed cooling loop 102 inside the heat exchanger 112, as illustrated by the dashed portion of the closed cooling loop 102 in FIG. 1. A vapor portion of the dielectric fluid may be condensed inside the closed cooling loop 102 and join a liquid portion of the dielectric fluid in the closed cooling loop 102 passing through the heat exchanger 102. A dielectric fluid may pass into the heat exchanger 112 and into an open space inside the heat exchanger 112. The vapor portion of the dielectric fluid may be condensed inside the heat exchanger 112 and join the liquid portion of the dielectric fluid inside the open space. The liquid portion of the dielectric fluid from the open space may be pumped by pump 108 into an inlet of the closed cooling loop 102 to be recirculated through the closed cooling loop 102.

The closed cooling loop 102 may enter pump 108 at pump inlet 116. The pump 108 may be inside a portion of the heat exchanger 112 or may be coupled to the circuit board 106 outside the heat exchanger 112 on another portion of the closed cooling loop 102.

The heat exchanger 112 may include a coolant flow to remove heat from the dielectric fluid circulated through the portion of the closed cooling loop 102 thermally coupled to heat exchanger 112. The closed cooling loop 102 may be thermally coupled to the heat exchanger 112 as illustrated by interface 118. The closed cooling loop 102 may be thermally coupled to the heat exchanger 112 in accordance with any type of thermal coupling used for heat exchangers. The heat exchanger 112 may be a condenser type heat exchanger where a coolant (condenser fluid) flows through the condenser to condense a vapor portion of the dielectric fluid. The coolant flow may enter at a coolant inlet 120 and may exit at a coolant exit 122 of the heat exchanger 112. A vapor portion of the dielectric fluid may condense from the heat removed by the coolant flow.

Some embodiments allow for a closed cooling loop 102 to be cooled in a heat exchanger/condenser by using an air-cooler system to condense the dielectric vapor in the closed cooling loop inside the heat exchanger/condenser. In this embodiment, the dielectric fluid may pass through the heat exchanger/condenser while air may be passed over the heat exchanger/condenser to remove heat from the dielectric fluid to condense a vapor portion of the dielectric fluid. This may allow implementation of embodiments in facilities lacking a liquid cooling medium to pump through the heat exchanger.

In some embodiments, a coolant of the coolant flow may include water, sea water, ethylene glycol, or propylene glycol. In some embodiments, a coolant of the coolant flow may be process water of a data center. In some embodiments, a coolant of the coolant flow is air passed over a portion of the closed cooling loop 102 in the heat exchanger 112. This portion of the closed cooling loop 102 may include fin structures coupled to the closed cooling loop to improve heat removal from the closed cooling loop to condense the vapor of the dielectric fluid.

Even if the cooling fluid used in the heat exchanger is changed or the approach to cooling in the heat exchanger is changed, such change may not affect the performance of cooling on a server board because that cooling is accomplished by the closed cooling loop 102 using a dielectric fluid. For example, the performance of the closed cooling loop may not be impacted regardless of whether the heat exchanger relies on air-to-liquid or liquid-to-liquid cooling.

In some embodiments, the closed cooling loop 102 may include an open space 124 inside the heat exchanger 112 to receive the dielectric fluid after the dielectric fluid has absorbed heat from the processors 104. The open space 124 may allow a liquid portion of the dielectric fluid to reside in the open space 124 according to gravity acting on the liquid portion. The open space 124 may allow a vapor portion of the dielectric fluid to reside in a space above the liquid portion. The coolant flow may be in a conduit 126 plumbed to pass into the open space at coolant inlet 120, span through the open space, and pass out of the open space at coolant exit 122.

In some embodiments, the conduit 126 may include a coil shape and/or may include a fin structure coupled to conduit 126 to increase surface area for cooling the dielectric fluid. The conduit 126 with the coolant flow may condense a portion of the vapor of the dielectric fluid on the exterior surfaces of the conduit 126. The condensed vapor of the dielectric fluid may join with the liquid portion of the dielectric fluid.

In some embodiments, the fluid pump 108 may be coupled to the open space 124 of the closed cooling loop 102 to pump the dielectric fluid from the open space 124 through the closed cooling loop 102. The fluid pump 108 may have a pump inlet 116 situated in the liquid portion of the dielectric fluid inside the open space 124.

In some embodiments, the closed cooling loop 102 may be pressurized to a pressure greater than atmospheric pressure.

In some embodiments, the closed cooling loop 102 may include one or more couplings and/or one or more valves 128 to add or remove the dielectric fluid in the closed cooling loop 102. The couplings and/or valves 128 may include one or more bleed valves. The couplings and/or valves 128 may be inline and/or external to the closed cooling loop 102. In some embodiments, the couplings and/or valves 128 may be coupled to a portion of the closed cooling loop 102 passing through the heat exchanger 112. In some embodiments, the couplings and/or valves 128 may be coupled to the open space 124 of the closed cooling loop 102 inside the heat exchanger 112.

In some embodiments of computing apparatus 100, the dielectric fluid may be pre-charged in the closed cooling loop 102. In some embodiments of computing apparatus 100, the dielectric fluid may be absent and subsequently charged into the closed cooling loop 102. In some embodiments, the dielectric fluid may be introduced into the closed cooling loop 102 using the one or more couplings and/or one or more valves 128.

In some embodiments, the closed cooling loop 102 may include one or more sensors to sense pressure, temperature, and flow rate of the dielectric fluid. In some embodiments, the sensors may be coupled to the circuit board 106 and the circuit board 106 may report data from the sensors via a network communications port coupled to the circuit board 106.

In some embodiments of the computing apparatus 100, the circuit board 106 and the heat exchanger 112 may be coupled as a single unit, with the closed cooling loop coupled as described previously and where the closed cooling loop 102 may be pre-charged with a dielectric fluid or chargeable with a dielectric fluid. In some embodiments, the circuit board 106 and the heat exchanger 112 may be separate units to be coupled to complete the closed cooling loop 102 after coupling.

Embodiments herein may be implemented as modular components, which may provide a cooling system that is flexible and capable. Furthermore, providing the heat exchanger 112 and closed cooling loop 102 as described may obviate the need for cooling cabinets with dedicated pump systems. This may, in turn, provide flexibility and headroom in a system layout.

All these major advantages of dielectric cooling may mitigate any concerns in the cooling system development process. Embodiments employing the dielectric cooling as discussed may enable high power density at component, rack and system levels.

Figure 2:
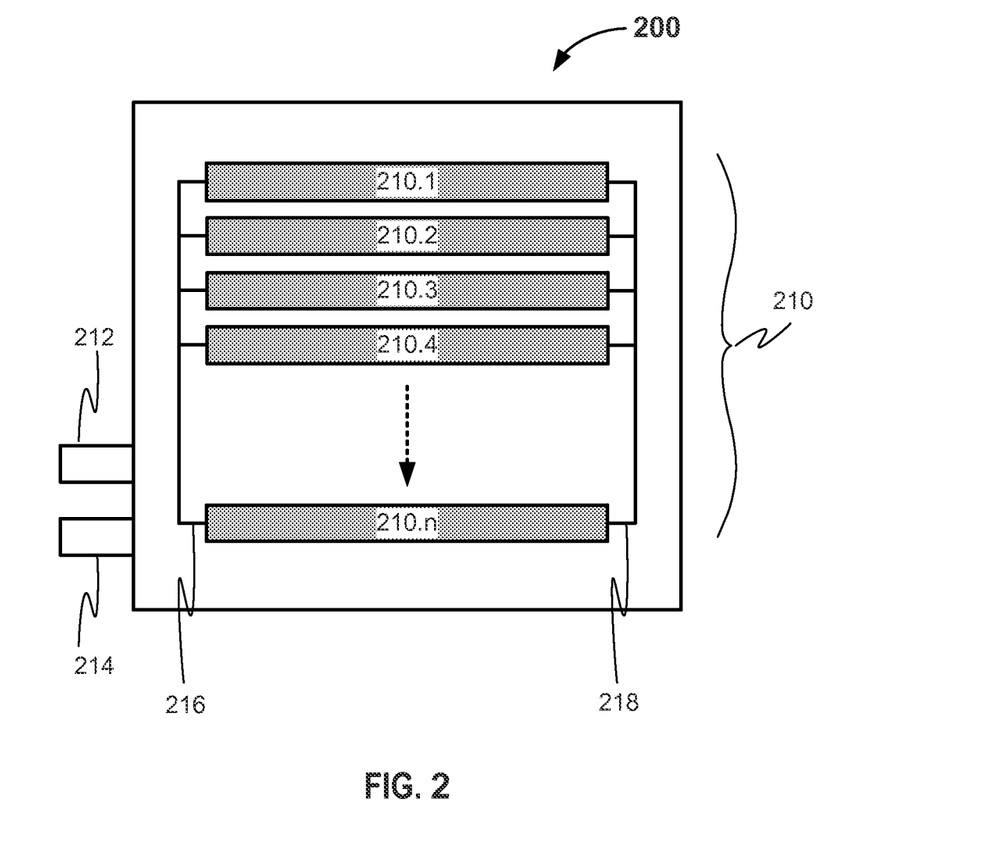
FIG. 2 schematically illustrates a rack system with server boards for computing in a data center, in accordance with some embodiments.

FIG. 2 schematically illustrates a rack system 200 with server boards 210 for computing in a data center, in accordance with some embodiments. The rack system 200 may comprise a plurality of server boards 210.1 to 210.*n*, where n may be 4, 6, 8, 10, 12, or more. The server boards 210 may comprise the computing apparatus 100 as illustrated in FIG. 1 and described previously. In some embodiments, the rack system 200 may have two or more server boards 210 that include the closed cooling loop 216. A portion of the closed cooling loop of a first server board 210.1 may be coupled to a portion of the closed cooling loop of a second server board 210.2. The dielectric fluid may circulate through the portions of the closed cooling loop in each of the server boards 210.1, 210.2 . . . 210.*n*.

In some embodiments, the rack system 200 may have two or more server boards 210 included in the closed cooling loop 216, wherein the closed cooling loop of a first server board 210.1 is coupled to the closed cooling loop of a second server board 210.2. The dielectric fluid may circulate through the closed cooling loop coupled to the server boards 210.1, 210.2.

In some embodiments, a coolant flow to a first heat exchanger of a first server board 210.1 may be coupled by line 218 to coolant flow of a second heat exchanger of a second server board 210.2. In some embodiments, the heat exchanger may be coupled to two or more closed cooling loops of two or more of the plurality of server boards 210.

In some embodiments, the rack system 200 may have a rack coolant flow inlet 212 and a rack coolant flow outlet 214. In some embodiments, the coolant may flow into the rack coolant flow inlet 212 to the heat exchangers of server boards 210 to cool dielectric fluid in the closed cooling loop 216 included in the server boards 210. In some embodiments, the coolant may flow into the rack coolant flow inlet 212 to a heat exchanger cooling two or more dielectric fluids of two or more server boards 210.

High power servers may produce approximately 3 to 4 kilowatts of heat per blade, which may provide a rack producing 100 kilowatts or more. These high power racks may be cooled efficiently by implementing various embodiments herein.

Some embodiments provide a modular rack server with the closed cooling loop, which provides a high-power, dense, rack-level solution that may be used even in mobile containers to speed up an installation process.

Various embodiments may be adaptable to anywhere in the world because the operating temperature may be from −65° C. to 100° C. Therefore, some embodiments may be implemented in a data center that is independent as to whether a climate is hot or cold, which can lower the operating costs for data centers due to the ability to select the data center location based on needs and not climate.

In some embodiments, there are no fans; the lack of fans results in less noise in a data center.

In some embodiments, the overall weight of a blade server and a rack system may be reduced considerably because these lighter materials may be used for cooling and the size of the cooling system may be considerably reduced. The weight of a server with the closed cooling loop may be the same or comparable to air-cooled servers so that there is no need to design special infrastructure such as base tiles or stiffening the structure support for the rack.

In some embodiments, multiple designs of servers may be placed in the same rack without modifying the cooling solution outside the server blade; accordingly, these servers may be different generations. The design may be modular so that expansion of a data center may be very easy by merely adding new racks next to existing racks without causing concerns regarding cooling of the old and new racks.

Some embodiments may have a centralized pump on a server rack so that during installation, facility water may be connected to an inlet and an outlet, which is quick and easy. Some embodiments may use hot-swappable pumps when there is centralized pumping adopted at the rack level. Some embodiments may use fresh water or sea water instead of facility water.

Figure 3:
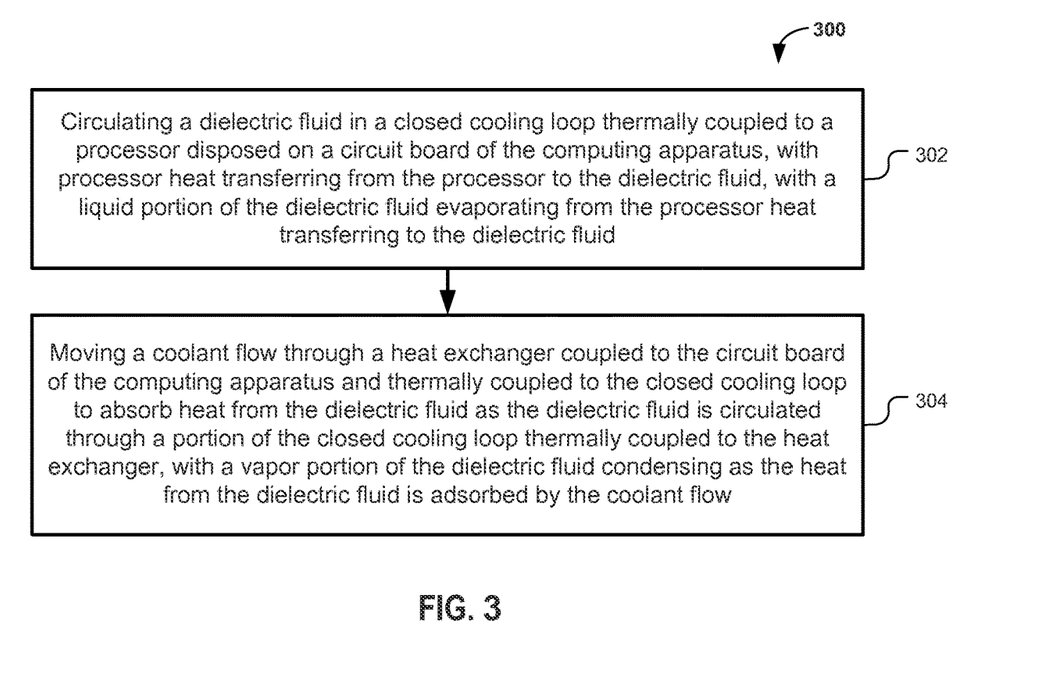
FIG. 3 schematically illustrates a method of cooling a computing apparatus with a closed cooling loop, in accordance with some embodiments.

FIG. 3 schematically illustrates a method 300 of cooling a computing apparatus with a closed cooling loop, in accordance with some embodiments.

At 302 of method 300, the method may comprise circulating a dielectric fluid in a closed cooling loop thermally coupled to a processor disposed on a circuit board of the computing apparatus, with processor heat transferring from the processor to the dielectric fluid, with a liquid portion of the dielectric fluid evaporating from the processor heat transferring to the dielectric fluid.

At 304 of method 300, the method 300 may further comprise moving a coolant flow through a heat exchanger coupled to the circuit board of the computing apparatus and thermally coupled to the closed cooling loop to absorb heat from the dielectric fluid as the dielectric fluid is circulated through a portion of the closed cooling loop thermally coupled to the heat exchanger, with a vapor portion of the dielectric fluid condensing as the heat from the dielectric fluid is absorbed by the coolant flow.

In some embodiments, the computing apparatus of method 300 is a blade server. In some embodiments, the closed cooling loop includes an aluminum cold plate directly coupled to the processor, wherein the dielectric fluid is circulated through the aluminum cold plate and absorbs processor heat while circulating through the aluminum cold plate. In some embodiments, the dielectric fluid is a refrigerant. In some embodiments, the refrigerant includes 1,1,1,2-tetrafluoroethane or 2,3,3,3-tetrafluoropropene. In some embodiments a fluid pump is circulating the dielectric fluid in the closed cooling loop. In some embodiments one or more additional processors are disposed on the circuit board, wherein the closed cooling loop circulates the dielectric fluid to absorb additional processor heat from the one or more additional processors, wherein an additional liquid portion of the dielectric fluid is evaporated from the additional processor heat absorbed by the dielectric fluid. In some embodiments at least a portion of the dielectric fluid remains in a liquid state in the closed cooling loop. In some embodiments the coolant flow includes water, ethylene glycol, or propylene glycol as a coolant in the coolant flow. In some embodiments the closed cooling loop is pressurized to a pressure greater than atmospheric pressure.

Various operations are described as multiple discrete operations in turn, in a manner that is most helpful in understanding the claimed subject matter. However, the order of description should not be construed as to imply that these operations are necessarily order dependent.

EXAMPLES

According to various embodiments, the present disclosure describes a number of embodiments related to devices, systems, and methods for a computing apparatus with a closed cooling loop coupled to a heat exchanger. Set forth below are numerous examples and implementations of the embodiments.

Example 1 of a computing apparatus may comprise: a circuit board; a processor coupled to the circuit board; a closed cooling loop thermally coupled to the processor; and a heat exchanger coupled to the circuit board and thermally coupled to the closed cooling loop, wherein the closed cooling loop is to circulate a dielectric fluid to absorb processor heat from the processor, wherein a liquid portion of the dielectric fluid is to evaporate from the processor heat absorbed by the dielectric fluid, wherein the heat exchanger is to include a coolant flow to remove heat from the dielectric fluid circulated through the portion of the closed cooling loop thermally coupled to heat exchanger, wherein a vapor portion of the dielectric fluid is to condense from the heat removed by the coolant flow.

Example 2 may include the subject matter of Example 1 and other examples herein, wherein the computing apparatus is a blade server.

Example 3 may include the subject matter of Example 1 and other examples herein, wherein the closed cooling loop includes an aluminum cold plate directly coupled to the processor, wherein the dielectric fluid is to circulate through the aluminum cold plate and to absorb the processor heat while circulating through the aluminum cold plate.

Example 4 may include the subject matter of Example 1 and other examples herein, wherein the dielectric fluid is a refrigerant.

Example 5 may include the subject matter of Example 4 and other examples herein, wherein the refrigerant includes 1,1,1,2-tetrafluoroethane or 2,3,3,3-tetrafluoropropene.

Example 6 may include the subject matter of Example 1 and other examples herein, wherein the computing apparatus may further comprise: the dielectric fluid included in the closed cooling loop.

Example 7 may include the subject matter of Example 1 and other examples herein, wherein the computing apparatus may further comprise: a fluid pump coupled to the closed cooling loop to pump the dielectric fluid through the closed cooling loop.

Example 8 may include the subject matter of Example 1 and other examples herein, wherein the computing apparatus may further comprise: one or more additional processors coupled to the circuit board, wherein the closed cooling loop is to circulate the dielectric fluid to absorb additional processor heat from the one or more additional processors, wherein an additional liquid portion of the dielectric fluid is to evaporate from the additional processor heat absorbed by the dielectric fluid.

Example 9 may include the subject matter of Example 1 and other examples herein, wherein the closed cooling loop is to allow at least a portion of the dielectric fluid to remain in a liquid state in the closed cooling loop.

Example 10 may include the subject matter of Example 1 and other examples herein, wherein a coolant of the coolant flow is to include water, sea water, ethylene glycol, or propylene glycol.

Example 11 may include the subject matter of Example 1 and other examples herein, wherein a coolant of the coolant flow is air.

Example 12 may include the subject matter of Example 1 and other examples herein, wherein the closed cooling loop includes an open space inside the heat exchanger to receive the dielectric fluid after the dielectric fluid has absorbed heat from the processor, and the coolant flow is in a conduit plumbed to pass into the open space, span through the open space, and pass out of the open space.

Example 13 may include the subject matter of Example 1 and other examples herein, wherein the closed cooling loop includes one or more couplings and one or more valves to add or remove the dielectric fluid in the closed cooling loop.

Example 14 may include the subject matter of Example 1 and other examples herein, wherein the closed cooling loop is thermally coupled to one or more non-processor devices coupled to the circuit board, wherein the dielectric fluid is to circulate through the closed cooling loop to absorb non-processor heat from the one or more non-processors, wherein a further liquid portion of the dielectric fluid is to evaporate from the non-processor heat absorbed by the dielectric fluid.

Example 15 may include the subject matter of Example 1 and other examples herein, wherein the closed cooling loop is pressurizable.

Example 16 of a blade server for computing may comprise: a circuit board; a plurality of processors disposed on the circuit board; a condenser coupled to the circuit board and including a conduit coupled to the condenser, the conduit to allow a condenser fluid to flow through the condenser; a closed cooling loop spanning the circuit board and thermally coupled to the plurality of processors and the condenser; and a fluid pump coupled to the closed cooling loop to pump a dielectric fluid through the closed cooling loop, wherein the pump is to circulate the dielectric fluid through the closed cooling loop to absorb processor heat from the plurality of processors, wherein a liquid portion of the dielectric fluid is to evaporate from the processor heat absorbed by the dielectric fluid, wherein the condenser is to transfer heat to the condenser fluid from the dielectric fluid circulated through the closed cooling loop that is thermally coupled to the condenser, wherein a vapor portion of the dielectric fluid is to condense by heat transfer to the condenser fluid.

Example 17 may include the subject matter of Example 16 and other examples herein, wherein the closed cooling loop includes an aluminum cold plate directly coupled to at least one of the plurality of processors, wherein the dielectric fluid is to circulate through the aluminum cold plate and to absorb processor heat while circulating through the aluminum cold plate.

Example 18 may include the subject matter of Example 16 and other examples herein, wherein the dielectric fluid is a refrigerant.

Example 19 may include the subject matter of Example 18 and other examples herein, wherein the refrigerant includes 1,1,1,2-tetrafluoroethane or 2,3,3,3-tetrafluoropropene.

Example 20 may include the subject matter of Example 16 and other examples herein, wherein the rack server may further comprise: the dielectric fluid in the closed cooling loop.

Example 21 may include the subject matter of Example 16 and other examples herein, wherein the closed cooling loop is to allow at least a portion of the dielectric fluid to remain in a liquid state in the closed cooling loop.

Example 22 may include the subject matter of Example 16 and other examples herein, wherein the coolant flow is to include water, sea water, ethylene glycol, or propylene glycol.

Example 23 may include the subject matter of Example 16 and other examples herein, wherein the coolant flow is air.

Example 24 may include the subject matter of Example 16 and other examples herein, wherein the processor heat is generated at a rate of up to 4 kilowatts.

Example 25 may include the subject matter of Example 16 and other examples herein, wherein the closed cooling loop includes an open space inside the condenser to receive the dielectric fluid after the dielectric fluid has absorbed heat from the plurality of processors, and the conduit is plumbed to pass into the open space, span through the open space, and pass out of the open space.

Example 26 may include the subject matter of Example 16 and other examples herein, wherein the closed cooling loop includes one or more couplings and one or more valves to add or remove the dielectric fluid in the closed cooling loop.

Example 27 may include the subject matter of Example 16 and other examples herein, wherein the closed cooling loop is thermally coupled to one or more non-processor devices coupled to the circuit board, wherein the pump is to circulate the dielectric fluid through the closed cooling loop to absorb non-processor heat from the one or more non-processors, wherein a further liquid portion of the dielectric fluid is to evaporate from the non-processor heat absorbed by the dielectric fluid.

Example 28 may include the subject matter of Example 16 and other examples herein, wherein the closed cooling loop is pressurizable.

Example 29 of a rack system for computing may comprise: a plurality of server boards, wherein at least one of the server boards comprises: a processor disposed on the at least one of the server boards; a heat exchanger coupled to the server board; and a closed cooling loop spanning the server board and thermally coupled to the processor and the heat exchanger, wherein the closed cooling loop is to circulate a dielectric fluid to absorb processor heat from the processor, wherein a liquid portion of the dielectric fluid is to evaporate from the processor heat absorbed by the dielectric fluid, wherein the heat exchanger is to include a coolant flow to remove heat from the dielectric fluid circulated through a section of the closed cooling loop thermally coupled to the heat exchanger, wherein a vapor portion of the dielectric fluid is to condense from the heat removed by the coolant flow in the heat exchanger.

Example 30 may include the subject matter of Example 29 and other examples herein, wherein the closed cooling loop includes an aluminum cold plate directly coupled to the processor, wherein the dielectric fluid is to circulate through the aluminum cold plate and to absorb the processor heat while circulating through the aluminum cold plate.

Example 31 may include the subject matter of Example 29 and other examples herein, wherein the dielectric fluid is a refrigerant.

Example 32 may include the subject matter of Example 31 and other examples herein, wherein the refrigerant includes 1,1,1,2-tetrafluoroethane or 2,3,3,3-tetrafluoropropene.

Example 33 may include the subject matter of Example 29 and other examples herein, wherein the rack system may further comprise: the dielectric fluid in the closed cooling loop.

Example 34 may include the subject matter of Example 29 and other examples herein, wherein the rack system may further comprise: a fluid pump coupled to the closed cooling loop to pump the dielectric fluid through the closed cooling loop.

Example 35 may include the subject matter of Example 29 and other examples herein, wherein the rack system may further comprise: one or more additional processors disposed on the at least one of the server boards, wherein the closed cooling loop is to circulate the dielectric fluid to absorb additional processor heat from the one or more additional processors, wherein an additional liquid portion of the dielectric fluid is to evaporate from the additional processor heat absorbed by the dielectric fluid.

Example 36 may include the subject matter of Example 29 and other examples herein, wherein the closed cooling loop is to allow at least a portion of the dielectric fluid to remain in a liquid state in the closed cooling loop.

Example 37 may include the subject matter of Example 29 and other examples herein, wherein the coolant flow includes water, sea water, ethylene glycol, or propylene glycol as a coolant in the coolant flow.

Example 38 may include the subject matter of Example 29 and other examples herein, wherein the coolant flow is air.

Example 39 may include the subject matter of Example 29 and other examples herein, wherein the closed cooling loop includes an open space inside the heat exchanger to receive the dielectric fluid after the dielectric fluid has absorbed heat from the processor, and the coolant flow is in a conduit plumbed to pass into the open space, span through the open space, and pass out of the open space.

Example 40 may include the subject matter of Example 29 and other examples herein, wherein the closed cooling loop includes one or more couplings and one or more valves to add or remove the dielectric fluid in the closed cooling loop.

Example 41 may include the subject matter of Example 29 and other examples herein, wherein two or more server boards include the closed cooling loop, wherein the closed cooling loop of a first server board is coupled to the closed cooling loop of a second server board.

Example 42 may include the subject matter of Example 29 and other examples herein, wherein coolant flow to a first heat exchanger of a first server board is coupled to coolant flow of a second heat exchanger of a second server board.

Example 43 may include the subject matter of Example 29 and other examples herein, wherein the heat exchanger is coupled to two or more closed cooling loops of two or more of the plurality of server boards.

Example 44 of a method of cooling a computing apparatus may comprise: circulating a dielectric fluid in a closed cooling loop thermally coupled to a processor disposed on a circuit board of the computing apparatus, with processor heat transferring from the processor to the dielectric fluid, with a liquid portion of the dielectric fluid evaporating from the processor heat transferring to the dielectric fluid; and moving a coolant flow through a heat exchanger coupled to the circuit board of the computing apparatus and thermally coupled to the closed cooling loop to absorb heat from the dielectric fluid as the dielectric fluid is circulated through a portion of the closed cooling loop thermally coupled to the heat exchanger, with a vapor portion of the dielectric fluid condensing as the heat from the dielectric fluid is absorbed by the coolant flow.

Example 45 may include the subject matter of Example 44 and other examples herein, wherein the computing apparatus is a blade server.

Example 46 may include the subject matter of Example 44 and other examples herein, wherein the closed cooling loop includes an aluminum cold plate directly coupled to the processor, wherein the dielectric fluid is circulated through the aluminum cold plate and absorbs processor heat while circulating through the aluminum cold plate.

Example 47 may include the subject matter of Example 44 and other examples herein, wherein the dielectric fluid is a refrigerant.

Example 48 may include the subject matter of Example 44 and other examples herein, wherein the refrigerant includes 1,1,1,2-tetrafluoroethane or 2,3,3,3-tetrafluoropropene.

Example 49 may include the subject matter of Example 44 and other examples herein, wherein a fluid pump is circulating the dielectric fluid in the closed cooling loop.

Example 50 may include the subject matter of Example 44 and other examples herein, wherein one or more additional processors are disposed on the circuit board, wherein the closed cooling loop circulates the dielectric fluid to absorb additional processor heat from the one or more additional processors, wherein an additional liquid portion of the dielectric fluid is evaporated from the additional processor heat absorbed by the dielectric fluid.

Example 51 may include the subject matter of Example 44 and other examples herein, wherein at least a portion of the dielectric fluid remains in a liquid state in the closed cooling loop.

Example 52 may include the subject matter of Example 44 and other examples herein, wherein the coolant flow includes water, sea water, ethylene glycol, or propylene glycol as a coolant in the coolant flow.

Example 53 may include the subject matter of Example 44 and other examples herein, wherein the coolant flow is air.

Example 54 may include the subject matter of Example 44 and other examples herein, wherein the closed cooling loop is pressurized to a pressure greater than atmospheric pressure.

Example 55 of a computing apparatus cooled by a phase change dielectric fluid in a cooling loop may comprise: circulate means for circulating a dielectric fluid in a closed cooling loop thermally coupled to a processor disposed on a circuit board of the computing apparatus, with processor heat transferring from the processor to the dielectric fluid, with a liquid portion of the dielectric fluid evaporating from the processor heat transferring to the dielectric fluid; and move means for moving a coolant flow through a heat exchanger coupled to the circuit board of the computing apparatus and thermally coupled to the closed cooling loop to absorb heat from the dielectric fluid as the dielectric fluid is circulated through a portion of the closed cooling loop thermally coupled to the heat exchanger, with a vapor portion of the dielectric fluid condensing as the heat from the dielectric fluid is absorbed by the coolant flow.

Example 56 may include the subject matter of example 55 and other examples herein, wherein the computing apparatus is a blade server.

Example 57 may include the subject matter of example 55 and other examples herein, wherein the closed cooling loop includes an aluminum cold plate directly coupled to the processor, wherein the dielectric fluid is circulated through the aluminum cold plate and absorbs processor heat while circulating through the aluminum cold plate.

Example 58 may include the subject matter of Example 55 and other examples herein, wherein the dielectric fluid is a refrigerant.

Example 59 may include the subject matter of Example 55 and other examples herein, wherein the refrigerant includes 1,1,1,2-tetrafluoroethane or 2,3,3,3-tetrafluoropropene.

Example 60 may include the subject matter of Example 55 and other examples herein, wherein a fluid pump is circulating the dielectric fluid in the closed cooling loop.

Example 61 may include the subject matter of Example 55 and other examples herein, wherein one or more additional processors are disposed on the circuit board, wherein the closed cooling loop circulates the dielectric fluid to absorb additional processor heat from the one or more additional processors, wherein an additional liquid portion of the dielectric fluid is evaporated from the additional processor heat absorbed by the dielectric fluid.

Example 62 may include the subject matter of Example 55 and other examples herein, wherein at least a portion of the dielectric fluid remains in a liquid state in the closed cooling loop.

Example 63 may include the subject matter of Example 55 and other examples herein, wherein the coolant flow includes water, sea water, ethylene glycol, or propylene glycol as a coolant in the coolant flow.

Example 64 may include the subject matter of Example 55 and other examples herein, wherein the coolant flow is air.

Example 65 may include the subject matter of Example 55 and other examples herein, wherein the closed cooling loop is pressurized to a pressure greater than atmospheric pressure.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. A computer server, comprising:
   a circuit board;
   a plurality of processors disposed on the circuit board;
   a plurality of cold plates respectively coupled to the plurality of processors thermally to correspondingly absorb processor heat from the plurality of processors;
   a closed cooling loop thermally coupled to the plurality of cold plates in series to circulate a dielectric fluid to serially absorb the processor heat from the plurality of cold plates to assist the cold plates in maintaining each of the plurality of processors at proximally a same temperature, wherein the dielectric fluid is initially in a fluid state and has a thermal characteristic where on absorption of the processor heat, the dielectric fluid transforms into a two phase state having a liquid portion and a vapor portion, and wherein the dielectric fluid is serially circulated through the plurality of cold plates at a flow rate about five to eight times slower than a flow rate of a single phase fluid; and
   a heat exchanger thermally coupled to a portion of the closed cooling loop to provide a coolant flow to remove the processor heat absorbed by the dielectric fluid, wherein on removal of the processor heat from the two phase state dielectric fluid by the coolant flow of the heat exchanger, the vapor portion of the two phase state dielectric fluid condenses, returning the dielectric fluid into the initial fluid state.

2. The computer server of claim 1, wherein the cold plates are aluminum cold plates.

3. The computer server of claim 1, wherein the closed cooling loop includes a pump to circulate the dielectric fluid, and the dielectric fluid is a phase change refrigerant.

4. The computer server of claim 3, wherein the refrigerant includes 1,1,1,2-tetrafluoroethane or 2,3,3,3-tetrafluoropropene.

5. The computer server of claim 1, wherein the closed cooling loop includes an open space inside the heat exchanger to receive the dielectric fluid in the two phase state after the dielectric fluid has absorbed the processor heat from the plurality of cold plates, and the coolant flow of the heat exchanger is in a conduit plumbed to pass into the open space, span through the open space, and pass out of the open space.

6. A blade server for computing, comprising:
   a circuit board;
   a plurality of processors disposed on the circuit board;
   a plurality of cold plates respectively coupled to the plurality of processors thermally to correspondingly absorb processor heat from the plurality of processors;
   a condenser coupled to the circuit board and including a conduit to allow a condenser fluid to flow through the condenser;
   a closed cooling loop spanning the circuit board and thermally coupled to the plurality of cold plates and the condenser in series; and
   a fluid pump coupled to the closed cooling loop to pump a dielectric fluid first through the closed cooling loop and then through the condenser, wherein the pump is to circulate the dielectric fluid first through the closed cooling loop to absorb processor heat from the plurality of processors, wherein the dielectric fluid is initially in a fluid state and has a thermal characteristic where on absorption of the processor heat, the dielectric fluid transforms into a two phase state having a liquid portion and a vapor portion; wherein the condenser is to transfer heat to the condenser fluid from the two phase state dielectric fluid, wherein on transfer of heat to the condenser fluid from the two phase state dielectric fluid, a vapor portion of the two phase state dielectric fluid is to condense, returning the dielectric fluid into the initial fluid state, and wherein the dielectric fluid is serially circulated through the plurality of cold plates at a flow rate five to eight times slower than a flow rate of a single phase fluid to assist the cold plates in maintaining each of the plurality of processors at proximally a same temperature.

7. The blade server of claim 6, wherein the cold plates are aluminum cold plates.

8. The blade server of claim 6, wherein the dielectric fluid is a refrigerant.

9. The blade server of claim 8, wherein the refrigerant includes 1,1,1,2-tetrafluoroethane or 2,3,3,3-tetrafluoropropene.

10. The blade server of claim 6, further comprising:
the dielectric fluid in the closed cooling loop.

11. The blade server of claim 6, wherein the closed cooling loop includes an open space inside the condenser to receive the dielectric fluid after the dielectric fluid has absorbed heat from the plurality of cold plates, and the conduit is plumbed to pass into the open space, span through the open space, and pass out of the open space.

12. A rack system for computing, comprising:
a plurality of server boards, wherein at least a first of the server boards comprises:
a plurality of processors disposed on the first server boards;
a plurality of cold plates respectively coupled to the plurality of processors to correspondingly absorb processor heat from the plurality of processors;
a heat exchanger coupled to the first server board; and
a closed cooling loop spanning the first server board and thermally coupled to the cold plates and the heat exchanger, in series wherein the closed cooling loop is to first circulate a dielectric fluid to absorb processor heat from the cold plates; wherein the dielectric fluid is initially in a fluid state and has a thermal characteristic where on absorption of the processor heat, the dielectric fluid transforms into a two phase state having a liquid portion and a vapor portion; wherein the heat exchanger is to include a coolant flow to remove heat from the two phase state dielectric fluid circulated through a section of the closed cooling loop thermally coupled to the heat exchanger, wherein on transfer of heat to the coolant flow from the two phase state dielectric fluid, a vapor portion of the dielectric fluid is to condense, returning the dielectric fluid into the initial fluid state and wherein the dielectric fluid is serially circulated through the plurality of cold plates at a flow rate five to eight times slower than a flow rate of a single phase fluid to assist the cold plates in maintaining each of the plurality of processors at proximally a same temperature.

13. The rack system of claim 12, wherein the cold plates are aluminum cold plates.

14. The rack system of claim 12, wherein the dielectric fluid is a refrigerant.

15. The rack system of claim 12, further comprising:
the dielectric fluid in the closed cooling loop.

16. The rack system of claim 12, wherein the closed cooling loop includes an open space inside the heat exchanger to receive the dielectric fluid after the dielectric fluid has absorbed heat from the cold plates, and the coolant flow is in a conduit plumbed to pass into the open space, span through the open space, and pass out of the open space.

17. A method of cooling a server, comprising:
circulating a dielectric fluid in a closed cooling loop thermally coupled to a plurality of cold plates in series, the plurality of cold plates being respectively coupled to a plurality of processors thermally to remove processor heat from the processors, the processors being disposed on a circuit board of the server, with the processor heat transferring from the cold plates to the dielectric fluid, wherein the dielectric fluid is initially in a fluid state and has a thermal characteristic where on absorption of the processor heat, the dielectric fluid transforms into a two phase state having a liquid portion and a vapor portion, wherein circulating the dielectric fluid comprises serially circulating the dielectric fluid through the plurality of cold plates at a flow rate five to eight times slower than a flow rate of a single phase fluid to assist the cold plates in maintaining each of the plurality of processors at proximally a same temperature; and
moving a coolant flow through a heat exchanger coupled to the circuit board of the server and thermally coupled to the closed cooling loop to absorb heat from the two phase state dielectric fluid as the two phase state dielectric fluid is circulated through a portion of the closed cooling loop thermally coupled to the heat exchanger, wherein on removal of the processor heat from the two phase state dielectric fluid by the coolant flow of the heat exchanger, the vapor portion of the dielectric fluid condenses, returning the dielectric fluid into the initial fluid state.

18. The method of claim 17, wherein the cold plates are aluminum cold plates.

19. The method of claim 17, wherein the dielectric fluid is a refrigerant.

20. The method of claim 17, wherein a fluid pump is circulating the dielectric fluid in the closed cooling loop.

* * * * *